(12) United States Patent
Ryu

(10) Patent No.: US 9,153,316 B1
(45) Date of Patent: Oct. 6, 2015

(54) CIRCUITS AND READ METHODS OF RRAM

(71) Applicant: Winbond Electronics Corp., Taichung (TW)

(72) Inventor: Douk Hyoun Ryu, San Jose, CA (US)

(73) Assignee: WINDBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 14/308,273

(22) Filed: Jun. 18, 2014

(51) Int. Cl.
*G11C 13/00* (2006.01)
(52) U.S. Cl.
CPC .......... *G11C 13/004* (2013.01); *G11C 13/0004* (2013.01); *G11C 2013/0045* (2013.01); *G11C 2013/0054* (2013.01); *G11C 2013/0057* (2013.01)
(58) Field of Classification Search
CPC ............ G11C 13/004; G11C 13/0004; G11C 2013/0054; G11C 2013/0045; G11C 2013/0057
USPC ............ 365/148, 158, 164, 189.07, 205, 207
See application file for complete search history.

(56) References Cited

U.S. PATENT DOCUMENTS

| | | |
|---|---|---|
| 7,236,389 B2 | 6/2007 | Hsu |
| 2010/0103725 A1* | 4/2010 | Kim et al. ...................... 365/163 |
| 2011/0080773 A1* | 4/2011 | El Baraji et al. ............... 365/158 |

* cited by examiner

*Primary Examiner* — Tan T Nguyen
(74) *Attorney, Agent, or Firm* — Muncy, Geissler, Olds & Lowe, P.C.

(57) ABSTRACT

An RRAM circuit includes word lines, bit lines, source lines, memory cells, and a sense module. Each of the memory cells includes a resistor and a transistor. The resistor alternates between a high impedance and a low impedance, and is coupled to one of the bit lines. The transistor is controlled by one of the word lines and coupled between the resistor and one of the source lines. The sense module includes a switch and a sense amplifier. The switch is controlled by an output signal and coupled to one of the bit lines. The sense amplifier compares the data voltage, which is generated by a current flowing through the switch and the resistor, and a reference voltage to generate the output signal. The switch is turned off when the data voltage exceeds the reference voltage, and is turned on otherwise.

12 Claims, 6 Drawing Sheets

CIRCUITS AND READ METHODS OF RRAM

BACKGROUND OF THE INVENTION

1. Field of the Invention

The disclosure relates generally to circuits and read methods of RRAM, and more particularly to circuits and read methods for reducing the read disturbance voltage level on bit lines.

2. Description of the Related Art

Recently, new nonvolatile memory devices, such as a resistance random access memory (RRAM), have been proposed. A unit cell of the RRAM includes a data storage element which has two electrodes and a variable resistive material layer interposed between the two electrodes. The variable resistive material layer, i.e., a data storage material layer, has a reversible variation in resistance according to whether a filament, a conductive path or a low resistive path is formed through the resistive material layer by the electrical signal (voltage or current) applied between the electrodes.

However, current RRAM has big concerns with read disturbance. If the bit line voltage level is higher than a certain voltage (e.g. 0.3V, depending on the process) in read operation, the RRAM memory cell's resistance value is changed and it causes the read operation to fail. To reduce read disturbance, we need to keep the bit line voltage level as low as possible. However, if the bit line voltage level is too low, the read access time could be extended.

BRIEF SUMMARY OF THE INVENTION

Controlling the bit line voltage level without extending the read access time would be beneficial for the RRAM read operation. This invention introduces a method of decreasing RRAM bit line read disturbance without extending the read access time. Therefore, an RRAM circuit and an RRAM read method are provided in the invention.

In an embodiment, an RRAM circuit comprises a word line array, a bit line array, a source line array, a plurality of memory cells, and a sense module. The word line array has an array of substantially parallel word lines therein. The bit line array has an array of substantially parallel bit lines therein. The source line array has an array of substantially parallel source lines therein. Each of the memory cells comprises a first resistor and a first transistor. The first resistor, which alternates between a high impedance and a low impedance, comprises a first node and a second node. The first node is coupled to one of the bit lines. The first transistor is controlled by one of the word lines and coupled between the second node and one of the source lines. The sense module comprises a first pull-up device, a first switch, and a first sense amplifier. The first pull-up device generates a first current. The first switch is controlled by a first output signal and coupled between the first pull-up device and one of the bit lines. A data voltage is generated by the first current flowing through the first switch and the first resistor to one of the source lines. The first sense amplifier compares the data voltage and a reference voltage to generate the first output signal. The first switch is turned off when the data voltage exceeds the reference voltage, and the first switch is turned on when the data voltage is less than the reference voltage.

In one embodiment, the sense module further comprises a second pull-up device. The second pull-up device is coupled to a reference device and generates a second current. The reference voltage is generated by the second current flowing through the reference device.

In one embodiment, the reference device is a reference transistor biased by a fixed voltage generated from a bandgap.

In one embodiment, the RRAM circuit further comprises a plurality of multiplexers and a data line. The multiplexers are coupled to the corresponding bit lines. The data line is coupled between the multiplexers and the first switch. The multiplexers select one of the bit lines to couple to the first switch through the data line.

In one embodiment, the RRAM circuit further comprises a complementary bit line array and a plurality of complementary memory cells. The complementary bit line array has an array of substantially parallel complementary bit lines therein. Each of the complementary memory cells comprises a second resistor and a second transistor. The second resistor, which alternates between the high impedance and the low impedance, comprises a third node and a fourth node. The third node is coupled to one of the complementary bit lines. The second resistor has different impedance than the first resistor. The second transistor is controlled by one of the word lines and coupled between the fourth node and one of the source lines. The sense module further comprises a second pull-up device, a second switch, and a second sense amplifier. The second pull-up device generates a second current. The second switch is controlled by a second output signal and coupled between the second pull-up device and one of the complementary bit lines. The reference voltage is generated by the second current flowing through the second switch and the second resistor to one of the source lines. The second sense amplifier compares the data voltage and the reference voltage to generate the second output signal. The second switch is turned off when the data voltage is less than the reference voltage, and the second switch is turned on when the data voltage exceeds the reference voltage.

In one embodiment, the RRAM circuit further comprises a plurality of multiplexers, a data line, a plurality of complementary multiplexers, and a complementary data line. The multiplexers are coupled to the corresponding bit lines. The data line is coupled between the multiplexers and the first switch. The multiplexers select one of the bit lines to couple to the first switch through the data line. The complementary multiplexers are coupled to the corresponding complementary bit lines. The complementary data line is coupled between the complementary multiplexers and the second switch, wherein the complementary multiplexers select one of the complementary bit lines to couple to the second switch through the complementary data line.

In one embodiment, an RRAM read method comprises connecting a memory cell to a word line, selecting one of the memory cells by the word line, generating a first current flowing through a first switch and the memory cell to the source line to generate a data voltage, generating a reference voltage, comparing the data voltage and the reference voltage to generate the first output signal, turning off the first switch when the data voltage exceeds the reference voltage, and turning on the first switch when the data voltage is less than the reference voltage. The memory cell comprises a first resistor and a first transistor. The first resistor alternates between a high impedance and a low impedance and is coupled to the bit line. The first transistor is controlled by the word line and coupled between the first resistor and the source line.

In one embodiment, the reference voltage is generated by a second current flowing through a reference device.

In one embodiment, the reference device is a reference transistor biased by a fixed voltage generated from a bandgap.

In one embodiment, the RRAM read method further comprises selecting the bit line by a multiplexer, and coupling the selected bit line to a data line, wherein the data line is coupled to the first switch.

In one embodiment, the RRAM read method further comprises selecting a complementary memory cell, generating a second current flowing through a second switch and the complementary memory cell to the source line to generate the reference voltage, comparing the data voltage and the reference voltage to generate a second output signal, turning off the second switch when the data voltage is less than the reference voltage, and turning on the second switch when the data voltage exceeds the reference voltage. The complementary memory cell comprises a second resistor coupled and a second transistor. The second transistor alternates between the high impedance and the low impedance and is coupled to a complementary bit line. The second transistor is controlled by the word line and coupled between the second resistor and the source line. The second resistor has a different impedance than the first resistor.

In one embodiment, the selecting step further comprises selecting the bit line by a multiplexer, coupling the selected bit line to a data line, wherein the data line is coupled to the first switch, selecting the complementary bit line by a complementary multiplexer, and coupling the selected complementary bit line to a complementary data line, wherein the complementary data line is coupled to the second switch.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
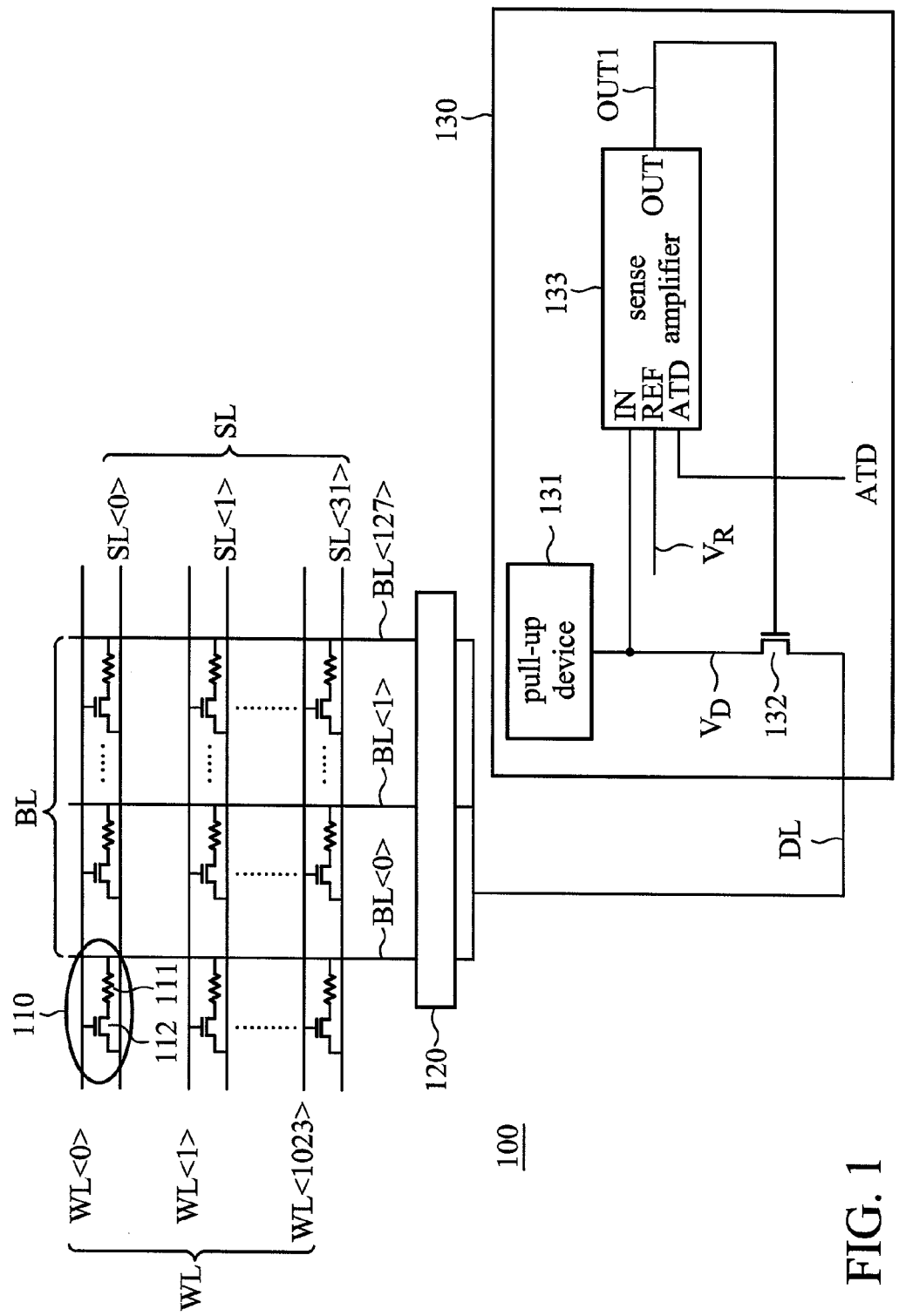
FIG. 1 is a schematic diagram of an RRAM circuit in accordance with an embodiment of the invention.

FIG. 1 is a schematic diagram of an RRAM circuit in accordance with an embodiment of the invention. As shown in FIG. 1, the RRAM circuit 100 includes the word line array WL, the source line array SL, the bit line array BL, a plurality of memory cells (including the memory cell 110), the multiplexer array 120, and the sense module 130. The word line array WL includes an array of substantially parallel word lines therein. The source line array SL includes an array of substantially parallel source lines therein. The bit line array BL includes an array of substantially parallel bit lines therein.

According to the embodiment of FIG. 1, there are 1024 word lines, 32 source lines, 128 bit lines, and 128 multiplexers. That is, the word line array WL includes word lines WL<0>, WL<1> ... WL<1023>, the source line array SL includes SL<0>, SL<1>...SL<31>, and the bit line array BL includes BL<0>, BL<1>... BL<127>.

In the following description, we use the memory cell 110 as an example to illustrate the memory cells. The memory cell 110 includes the first resistor 111 and the first transistor 112. The first resistor 111, which alternates between a high impedance and a low impedance, is coupled to the bit line BL<0>. According to an embodiment of the invention, the memory cell 110 is a set cell when the first resistor 111 has a low impedance, and the memory cell 110 is a reset cell when the first resistor 111 has a high impedance. The first transistor 112 is controlled by the word line WL<0> and coupled between the first resistor 111 and the source line SL<0>.

According to an embodiment of the invention, the multiplexer array 120 includes 128 multiplexers Y<0>, Y<1> ... Y<127> which are coupled to the corresponding bit lines. The multiplexer array 120 selects one of the bit lines to couple to the data line DL which is coupled to the sense module 130. The data stored in the selected memory cell is then read by the sense module 130 through the data line DL. According to another embodiment of the invention, each bit line is sensed by an individual sense module, so that 128 bit lines lead to 128 sense modules. However, the chip area can be greatly reduced when 128 bit lines are corresponding to a single sense module instead of 128 sense modules.

The sense module 130 includes a pull-up device 131, a switch 132, and a sense amplifier 133. The pull-up device 131 is configured to generate a first current. The switch 132 is controlled by the first output signal OUT1 and coupled between the pull-up device 131 and the data line DL. The sense amplifier 133 compares the data voltage $V_D$ and the reference voltage $V_R$ to generate the first output signal OUT1.

The switch 132 is turned off when the data voltage $V_D$ exceeds the reference voltage $V_R$, and the switch 132 is turned on when the data voltage $V_D$ is less than the reference voltage $V_R$. According to an embodiment of the invention, the switch 132 is an N-type transistor. The switch 132 is turned on when the first output signal OUT1 is at a high logic level or turned off when the first output signal OUT1 is at a low logic level. The operation of the RRAM circuit 100 is described below.

Figure 2:
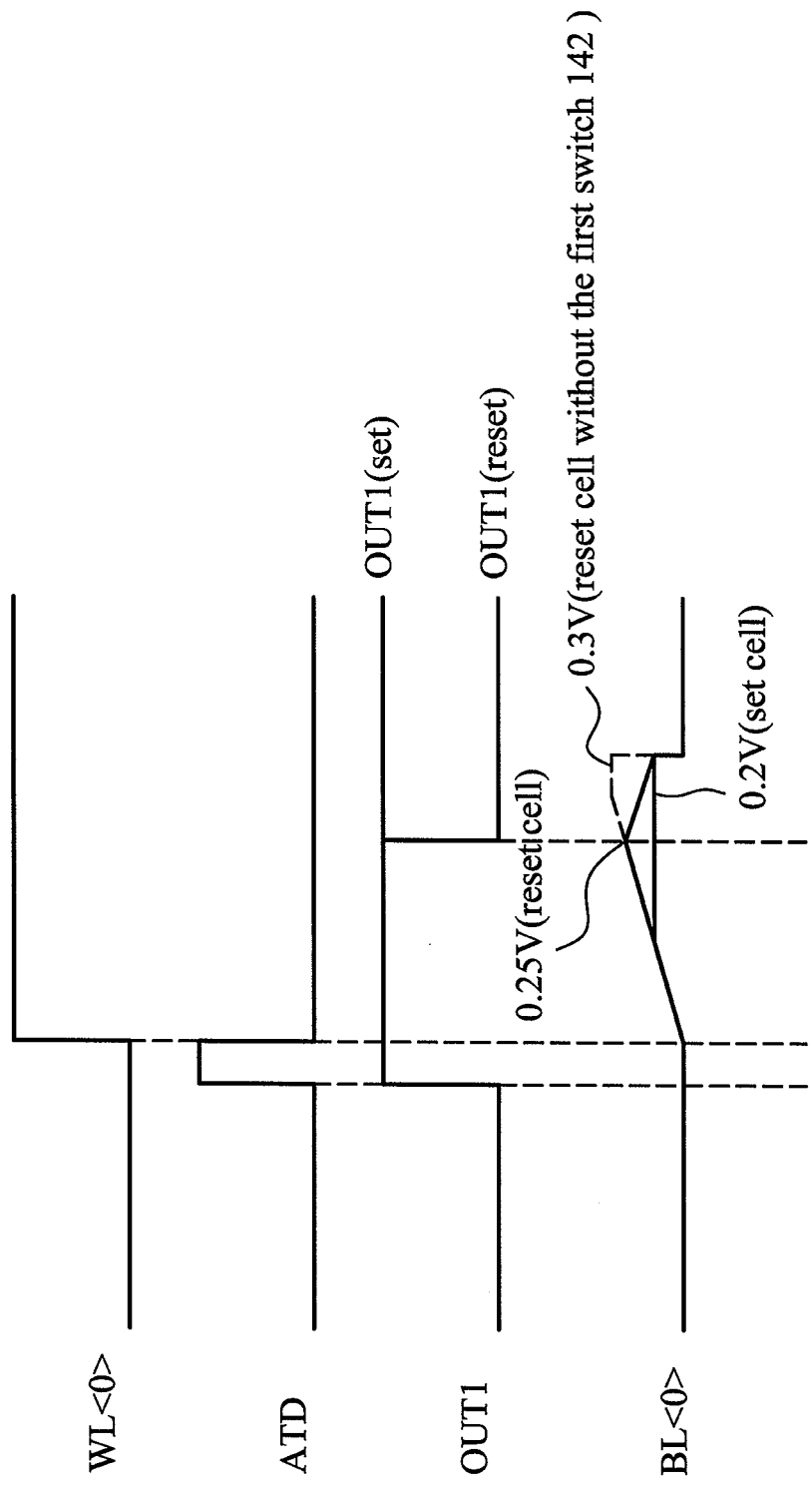
FIG. 2 illustrates the operation of the RRAM circuit 100 in FIG. 1 in accordance with an embodiment of the invention.

FIG. 2 illustrates the operation of the RRAM circuit 100 in FIG. 1 in accordance with an embodiment of the invention. Before starting the sensing, the initial signal ATD has an impulse to reset the sense amplifier 133 of FIG. 1 and pull up the first output signal OUT1 to high logic level. The word line WL<0> is asserted to select the first row of the memory cells. The multiplexer Y<0> is activated to select the bit line BL<0> to be read. The pull-up device 131 is configured to generate a current. Due to the first output signal OUT1 being reset to a high logic level, the switch 132 is turned on, and the current flows through the switch 132, the first resistor 111, and the first transistor 112 to the source line SL<0>, which is coupled to the ground, to generate the data voltage $V_D$. During the read operation, all the source lines are coupled to the ground.

According to an embodiment of the invention, the bit line voltage level should be less than 0.3V during a read operation, or the read memory cell would be under a weak set operation. According to an embodiment of the invention, without the switch 132, the data voltage $V_D$ is 0.3V if the selected memory cell is a reset cell, and 0.2V if the selected memory cell is a set cell. The reference voltage $V_R$ is 0.25V.

When the selected first memory cell 110 is a reset cell, the first output signal OUT1 converts from high to low during the data voltage $V_D$ exceeding 0.25V. Then, the switch 132 is turned off and the bit line BL<0> starts decreasing. As a result, the bit line doesn't reach 0.3V, or the impedance of the first resistor 111 will be lowered under weak set operation. When the selected first memory cell 110 is a set cell, the first output signal OUT1 remains in high logic level since the first resistor 111 is in the low impedance and the data voltage $V_D$ is less than the reference voltage $V_R$.

Figure 3:
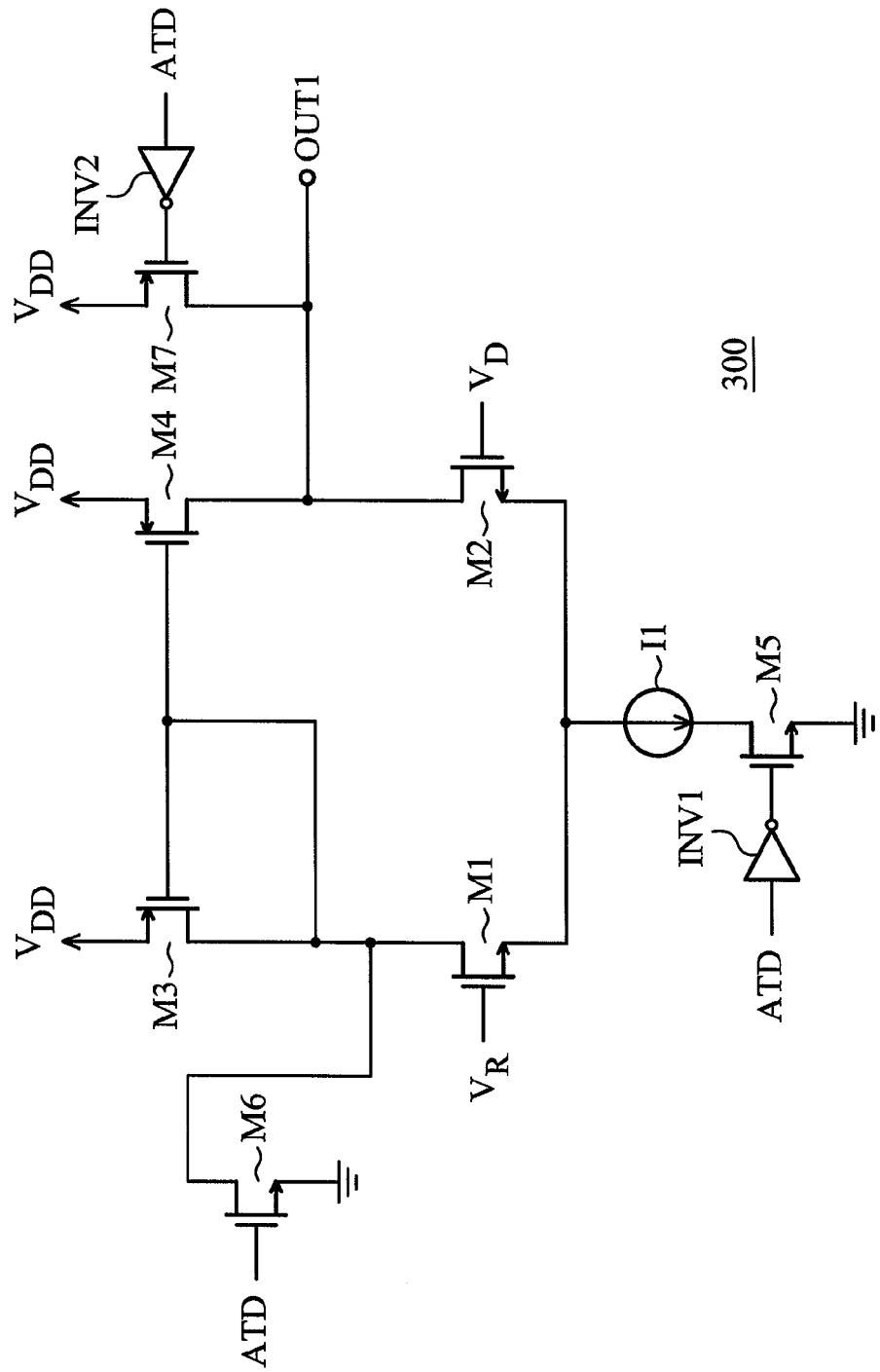
FIG. 3 is a schematic of the sense amplifier in accordance with an embodiment of the invention.

FIG. 3 is a schematic of the sense amplifier in accordance with an embodiment of the invention. According to an embodiment of the invention, the sense amplifier 300 is illustrated in FIG. 3. A differential input pair of the sense amplifier 300 is formed by NMOS M1 and M2, and a current mirror is form by the PMOS M3 and M4. As shown in FIG. 3, the first output signal OUT1 is in high logic level when a voltage of the input terminal IN is less than a voltage of the reference terminal REF. Otherwise, the first output signal OUT1 is in low logic level. Therefore, the input terminal IN of the sense amplifier 133 in FIG. 1 is coupled to the data voltage $V_D$, and the reference voltage REF is coupled to the reference voltage $V_R$.

In addition, M5, M6, and M7, which are controlled by the initial signal ATD or its inverse, are configured to initiate the sense amplifier 300. When the initial signal ATD is high, M5 is turned off and M6 and M7 are turned on. The output signal is pulled high by both M4 and M7. After the initial signal ATD goes low, the sense amplifier 300 returns to normal operation and compares the data voltage $V_D$ and the reference voltage $V_R$.

Figure 4:
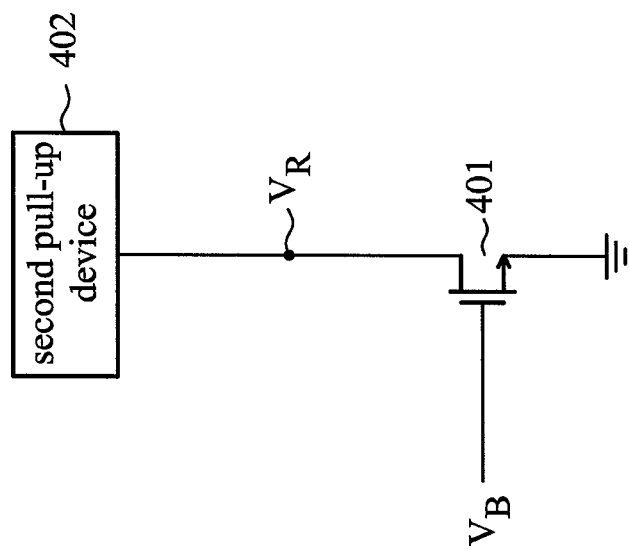
FIG. 4 illustrates the generation of the reference voltage $V_R$ in accordance with an embodiment of the invention.

FIG. 4 illustrates the generation of the reference voltage $V_R$ in accordance with an embodiment of the invention. The second pull-up device 402 is coupled to the transistor 401 biased by the bias voltage $V_B$. According to an embodiment of the invention, the bias voltage $V_B$ is generated by a bandgap. Therefore, the reference voltage $V_R$ can be properly controlled to be between 0.2V to 0.3V.

Figure 5:
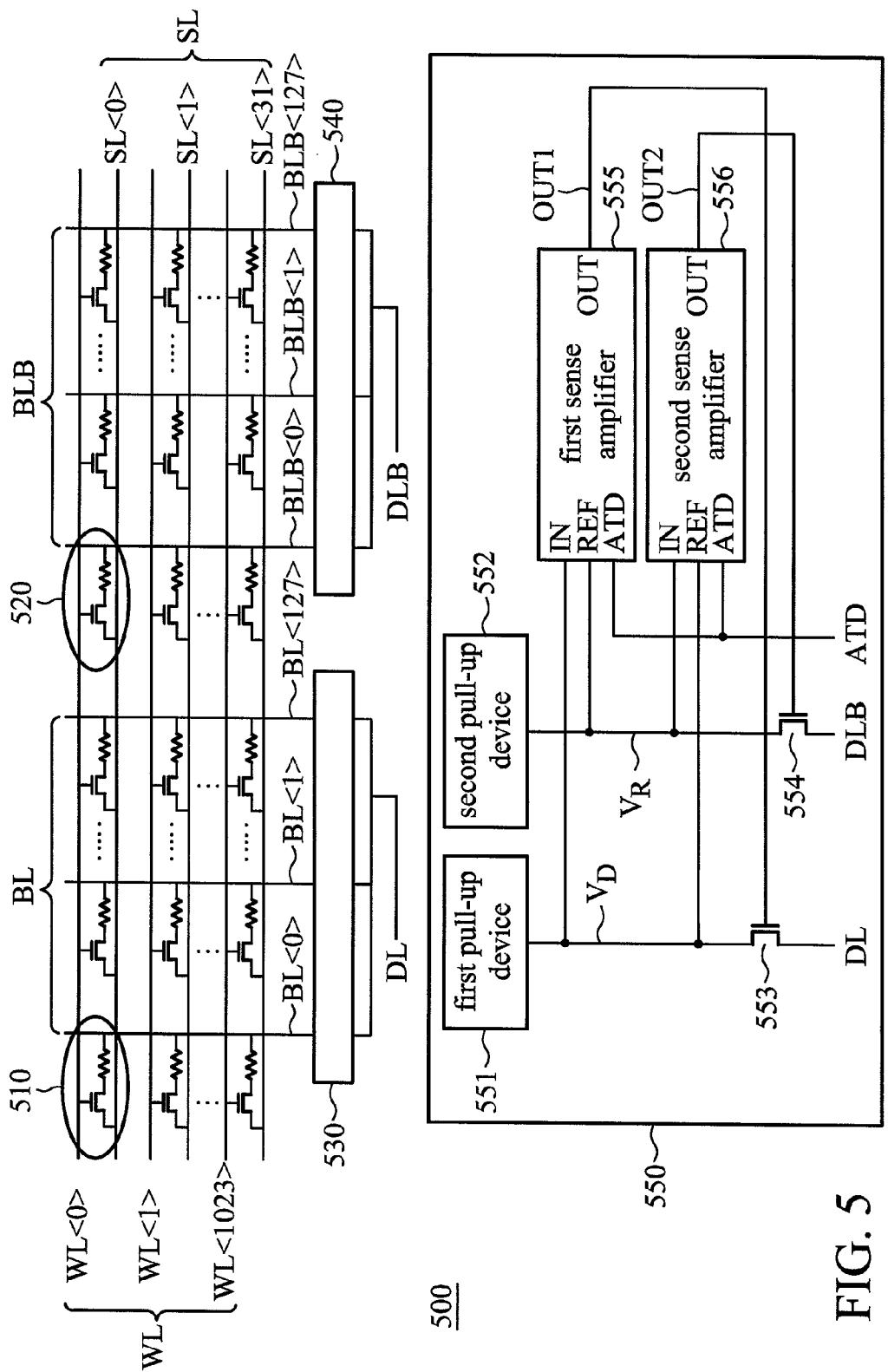
FIG. 5 is a schematic diagram of an RRAM circuit in accordance with another embodiment of the invention.

FIG. 5 is a schematic diagram of an RRAM circuit in accordance with another embodiment of the invention. As shown in FIG. 5, the RRAM circuit 500 includes the word line array WL, the source line array SL, the bit line array BL, the complementary bit line array BLB, a plurality of memory cells (including the memory cell 510), a plurality of complementary memory cells (including the complementary memory cell 520), the multiplexer array 530, the complementary multiplexer array 540, and the sense module 550. The word line array WL and the source line array SL are identical to those in FIG. 1.

As shown in FIG. 5, the memory cells and the complementary memory cells share the word line array WL and the source line array SL. The memory cell 510 and the complementary memory cell 520 are identical to the memory cell 110.

According to an embodiment of the invention, when the memory cell 510 is written to be a reset cell with high impedance, the complementary memory cell 520 must be written to be a set cell with low impedance. According to another embodiment of the invention, when the memory cell 510 is written to be a set cell with the low impedance, the complementary memory cell 520 must be written to be a reset cell with the high impedance.

The memory cell 510 can be read by the bit line BL<0>, and the complementary memory cell 520 can be read by the complementary bit line BLB<0>. The multiplexer array 530 including the multiplexers Y<0>, Y<1> . . . Y<127> selects one of the bit lines BL<0>, BL<1> . . . BL<127> to couple to the data line DL. Similarly, one of the complementary bit lines BLB<0>, BLB<1> . . . BLB<127>, which is corresponding to the selected bit line, is selected by the complementary multiplexer array 540 to couple to the complementary data line DLB.

The sense module 550 simultaneously accesses two memory cells (i.e. the memory cell 510 and the complementary memory cell 520) in complement read operation. In other words, the reference voltage $V_R$ in FIG. 1 is generated by the complementary memory cell which is corresponding to the sensed memory cell.

The sense module 550 includes the first pull-up device 551, the second pull-up device 552, the first switch 553, the second switch 554, the first sense amplifier 555, and the second sense amplifier 556. The first pull-up device 551 and the second pull-up device 552 generate the first and second current, respectively. The first and second currents flow through the selected memory cell and the selected complementary memory cell to generate the data voltage $V_D$ and the reference voltage $V_R$ respectively.

According to an embodiment of the invention, when the selected memory cell or the selected complementary memory cell is a set cell, the data voltage $V_D$ and the reference voltage $V_R$ is 0.2V. According to another embodiment of the invention, when the selected memory cell or the selected complementary memory cell is a reset cell, the data voltage $V_D$ and the reference voltage $V_R$ is 0.3V. However, the selected memory cell and the selected complementary cell must be in complementary states. That is, one of the selected memory cell or the selected memory cell is a set cell, and the other one must be a reset cell.

The first switch 553 and the second switch 554 are respectively configured to keep the data voltage $V_D$ and the reference voltage $V_R$ under a predetermined voltage. Otherwise, the selected memory cell or the selected complementary cell will suffer from a weak set operation. According to an embodiment of the invention, the predetermined voltage is 0.3V.

Before starting sensing, the initial signal ATD resets the first sense amplifier 555 and the second sense amplifier 556 and pulls the first output signal OUT1 and the second output signal OUT2 to high logic level. The first sense amplifier 555 compares the data voltage $V_D$ to the reference voltage $V_R$ to generate the first output signal OUT1. When the data voltage $V_D$ exceeds the reference voltage $V_R$, the first switch 553 is turned off by the first output signal OUT1. Otherwise, the first switch 553 remains turned on.

According to an embodiment of the invention, the first switch is implemented by an N-type transistor. When the data voltage $V_D$ exceeds the reference voltage $V_R$, the first output signal OUT1 is in low logic level, and the first switch 553 is then turned off by the first output signal OUT1. Otherwise, the first output signal OUT1 remains in high logic level, and the first switch 553 remains turned on.

The second sense amplifier 556 compares the reference voltage $V_R$ to the data voltage $V_D$ to generate the second output signal OUT2. When the reference voltage $V_R$ exceeding the data voltage $V_D$, the second switch 554 is turned off by the second output signal OUT2. Otherwise, the second switch 554 remains turned on. According to an embodiment of the invention, the first sense amplifier 555 and the second sense amplifier 556 can be implemented by the sense amplifier 300 in FIG. 3.

According to an embodiment of the invention, a set of data line DL and complementary data line DLB is corresponding to a sense module, instead of a set of bit line BL and complementary BLB corresponding to a sense module. That is, 128 sets of bit lines and complementary bit lines share a sense module, and the chip area of 127 sense modules is saved.

Figure 6:
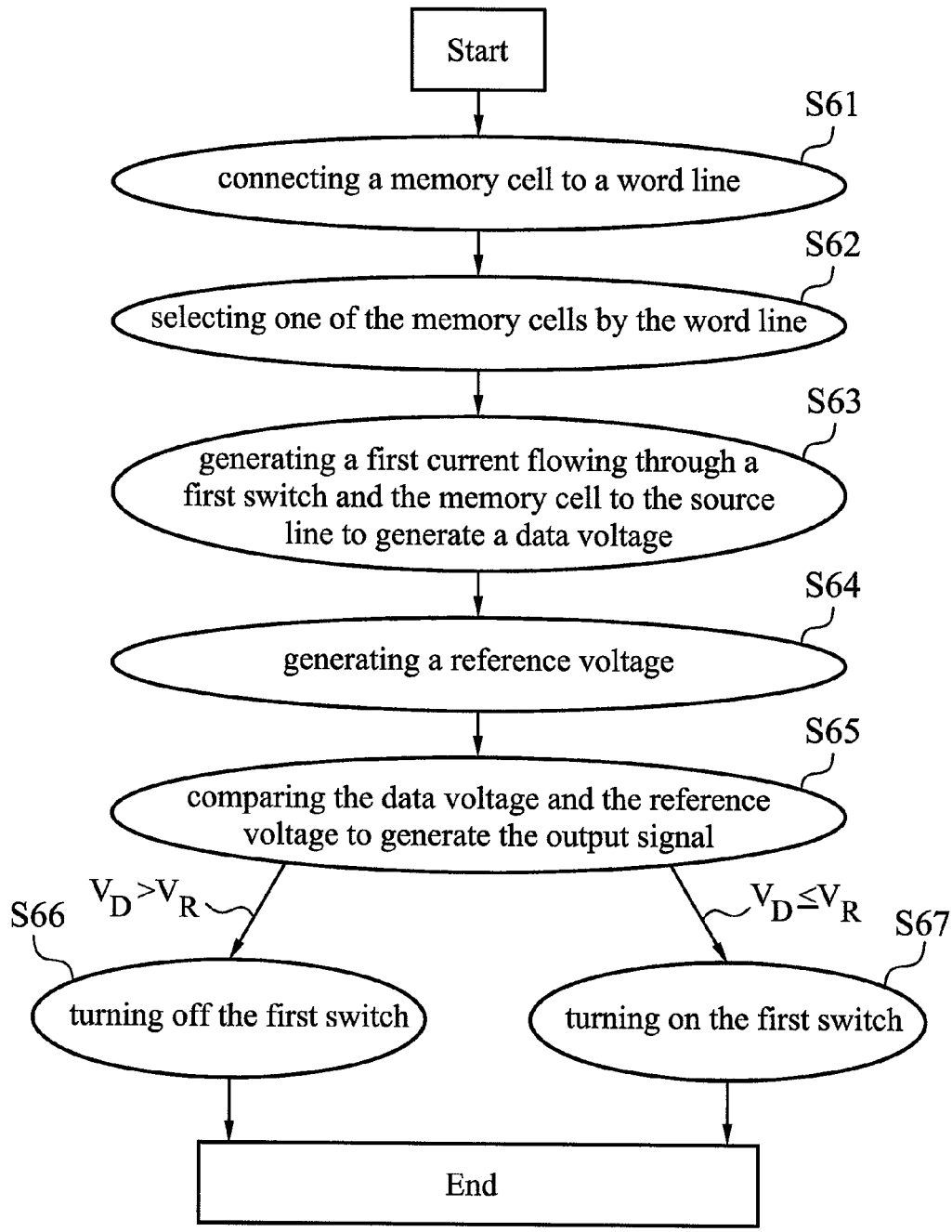
FIG. 6 is a flow chart of RRAM read method in accordance with an embodiment of the invention.

FIG. 6 is a flow chart of an RRAM read method in accordance with an embodiment of the invention. To clarify the operation of the RRAM read method, the description of FIG. 6 is accompanied with FIG. 1. The memory cell 110 is connected to the word line WL<0>, the source line SL<0>, and the bit line BL<0> (Step S61). The memory cell 110 is selected by the word line WL<0> (Step S62).

The pull-up device 131 generates a first current flowing through the switch 132 and the memory cell 110 to the source line SL<0> to generate the data voltage $V_D$ (Step S63). While sensing the memory cell 110, all the source lines are coupled to the ground. Then, the reference voltage $V_R$ is generated (Step S64). The sense amplifier 133 compares the data voltage $V_D$ to the reference voltage $V_R$ to generate the first output signal OUT1 (Step S65). When the data voltage $V_D$ exceeds the reference voltage $V_R$, the switch 132 is turned off by the first output signal OUT1 (Step S66). When the data voltage $V_D$ does not exceed the reference voltage $V_R$, the switch 132 is turned on by the first output signal OUT1 (Step S67).

An RRAM circuit with decreased read disturbance and an RRAM read method are provided in the invention. The voltage across the resistor of the selected memory cell can be limited under a predetermined voltage level by the switch controlled by the output signal of the sense amplifier. After the switch is turned off, the voltage across the resistor of the selected memory cell is discharged due to the selected memory cell being coupled to the ground. Therefore, the read disturbance is decreased and eliminated.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. An RRAM circuit comprising:
   a word line array having an array of substantially parallel word lines therein;
   a bit line array having an array of substantially parallel bit lines therein;
   a source line array having an array of substantially parallel source lines therein;
   a plurality of memory cells, wherein each of the memory cells comprises:
      a first resistor, alternating between a high impedance and a low impedance, comprising a first node and a second node, wherein the first node is coupled to one of the bit lines; and
      a first transistor controlled by one of the word lines and coupled between the second node and one of the source lines; and
   a sense module comprising:
      a first pull-up device, generating a first current;
      a first switch controlled by a first output signal and coupled between the first pull-up device and one of the bit lines, wherein a data voltage is generated by the first current flowing through the first switch and the first resistor to one of the source lines; and
      a first sense amplifier comparing the data voltage and a reference voltage to generate the first output signal, wherein the first switch is turned off when the data voltage exceeds the reference voltage, and the first switch is turned on when the data voltage is less than the reference voltage.

2. The RRAM circuit of claim 1, wherein the sense module further comprises:
   a second pull-up device coupled to a reference device and generating a second current, wherein the reference voltage is generated by the second current flowing through the reference device.

3. The RRAM circuit of claim 2, wherein the reference device is a reference transistor biased by a fixed voltage generated from a bandgap.

4. The RRAM circuit of claim 1, further comprising:
   a plurality of multiplexers coupled to the corresponding bit lines; and
   a data line coupled between the multiplexers and the first switch, wherein the multiplexers select one of the bit lines to couple to the first switch through the data line.

5. The RRAM circuit of claim 1, further comprising:
   a complementary bit line array having an array of substantially parallel complementary bit lines therein; and
   a plurality of complementary memory cells, wherein each of the complementary memory cells comprises:
      a second resistor, alternating between the high impedance and the low impedance, comprising a third node and a fourth node, wherein the third node is coupled to one of the complementary bit lines, wherein the second resistor has different impedance than the first resistor; and
      a second transistor controlled by one of the word lines and coupled between the fourth node and one of the source lines,
   wherein the sense module further comprises:
      a second pull-up device, generating a second current
      a second switch controlled by a second output signal and coupled between the second pull-up device and one of the complementary bit lines, wherein the reference voltage is generated by the second current flowing through the second switch and the second resistor to one of the source lines; and
      a second sense amplifier comparing the data voltage and the reference voltage to generate the second output signal, wherein the second switch is turned off when the data voltage is less than the reference voltage, and the second switch is turned on when the data voltage exceeds the reference voltage.

6. The RRAM circuit of claim 5, further comprising:
   a plurality of multiplexers coupled to the corresponding bit lines;
   a data line coupled between the multiplexers and the first switch, wherein the multiplexers select one of the bit lines to couple to the first switch through the data line;
   a plurality of complementary multiplexers coupled to the corresponding complementary bit lines; and
   a complementary data line coupled between the complementary multiplexers and the second switch, wherein the complementary multiplexers select one of the complementary bit lines to couple to the second switch through the complementary data line.

7. An RRAM read method comprising:
   connecting a memory cell to a word line, a source line, and a bit line, wherein the memory cell comprises a first resistor and a first transistor, wherein the first resistor alternates between a high impedance and a low impedance and is coupled to the bit line, wherein the first transistor is controlled by the word line and is coupled between the first resistor and the source line;
   selecting one of the memory cells by the word line;

generating a first current flowing through a first switch and the memory cell to the source line to generate a data voltage;
generating a reference voltage;
comparing the data voltage and the reference voltage to generate the first output signal;
turning off the first switch when the data voltage exceeds the reference voltage; and
turning on the first switch when the data voltage is less than the reference voltage.

8. The RRAM read method of claim 7, wherein the reference voltage is generated by a second current flowing through a reference device.

9. The RRAM read method of claim 8, wherein the reference device is a reference transistor biased by a fixed voltage generated from a bandgap.

10. The RRAM read method of claim 7, further comprising:
selecting the bit line by a multiplexer; and
coupling the selected bit line to a data line, wherein the data line is coupled to the first switch.

11. The RRAM read method of claim 7, further comprising:
selecting a complementary memory cell, corresponding to the memory cell, by the word line, wherein the complementary memory cell comprises a second resistor and a second transistor, wherein the second transistor alternates between the high impedance and the low impedance and is coupled to a complementary bit line, wherein the second transistor is controlled by the word line and is coupled between the second resistor and the source line, wherein the second resistor has different impedance than the first resistor;
generating a second current flowing through a second switch and the complementary memory cell to the source line to generate the reference voltage;
comparing the data voltage and the reference voltage to generate a second output signal;
turning off the second switch when the data voltage is less than the reference voltage; and
turning on the second switch when the data voltage exceeds the reference voltage.

12. The RRAM read method of claim 11, wherein the selecting step further comprises:
selecting the bit line by a multiplexer;
coupling the selected bit line to a data line, wherein the data line is coupled to the first switch
selecting the complementary bit line by a complementary multiplexer; and
coupling the selected complementary bit line to a complementary data line, wherein the complementary data line is coupled to the second switch.

* * * * *